United States Patent [19]
Jackson et al.

[11] Patent Number: 4,912,839
[45] Date of Patent: Apr. 3, 1990

[54] ELECTRONIC COMPONENT INSERTION MACHINE

[75] Inventors: Rodney P. Jackson, Auburn, N.H.; Robert J. Sooy, Marblehead, Mass.; Henry L. Wright, Ipswich, Mass.; William H. Mirley, Jr., North Reading, Mass.; Peter M. Kittredge, Everett, Mass.

[73] Assignee: Emhart Industries Inc., Towson, Md.

[21] Appl. No.: 193,343

[22] Filed: May 19, 1988

[51] Int. Cl.$^4$ .............................................. B23P 19/00
[52] U.S. Cl. ......................................... 29/741; 29/740
[58] Field of Search ......................... 29/741, 739, 740

[56] References Cited
U.S. PATENT DOCUMENTS 3,550,238 12/1970 Allen et al. ............................ 29/741
4,615,089 10/1986 Wright et al. ......................... 29/741

*Primary Examiner*—Joseph M. Gorski
*Assistant Examiner*—I. Cuda
*Attorney, Agent, or Firm*—Spencer T. Smith

[57] ABSTRACT

A DIP insertion machine is disclosed wherein the feeder, inserter, valve stack for the feeder and inserter and electronic distribution panels for the valve stack, feeder and inserter are all mounted on a single plate which is secured to a mounting bracket attached to the bottom of the cross-beam on which the component magazines and shuttle are secured.

3 Claims, 3 Drawing Sheets

ELECTRONIC COMPONENT INSERTION MACHINE

A dual in-line package (DIP) electronic component insertion machine inserts DIP components into a supported circuit board. In conventional electronic component insertion machines, such as are illustrated in U.S. Pats. numbered 3,550,238, and 4,450,619, a circuit board is supported above a cut-clinch mechanism and below an insertion mechanism. An overhead cross beam or rail extends over the work area and supports a plurality of component magazines and a picker which accepts components from the magazines and delivers them to a feeder. The feeder sequentially feeds the components to an inserter.

The feeder and inserter are conventionally secured via numerous brackets to the cross rail and are electrically controlled by distribution panels which are a part of the electronic control box and are pneumatically controlled by valve stacks which are secured to the machine base.

It is accordingly an object of the present invention to provide an improved feeder and inserter assembly.

Other objects and advantages of the present invention will become apparent from the following portion of the specification and from the following drawings which illustrate, in accordance with the mandate of the Patent statutes, a presently preferred embodiment incorporating the principles of the invention.

Referring to the drawings.

Figure 1:
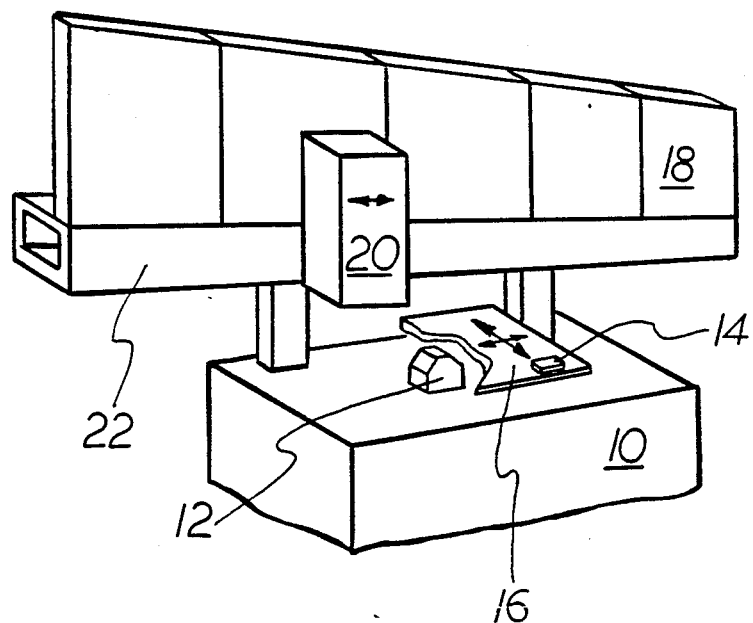
FIG. 1 is an oblique schematic view of a DIP insertion machine.

A DIP insertion machine includes a machine base 10 on which is located a cut-clinch mechanism 12 which can cut to length the leads of a DIP component 14 inserted into a supported circuit board 16 and then clinch the cut leads to secure the component to the circuit board. The circuit board has two axes of displacement so that an inserted component can be located above the cut-clinch mechanism. The components to be inserted are sequentially removed from a number of component magazines 18 and are delivered :o the feeder-inserter assembly (FIG. 4) by a shuttle assembly 20. The magazines 18 are supported on a cross beam or rail 22 which spans the work area and the shuttle assembly 20 is selectively displaceable along the cross beam 22.

Figure 2:
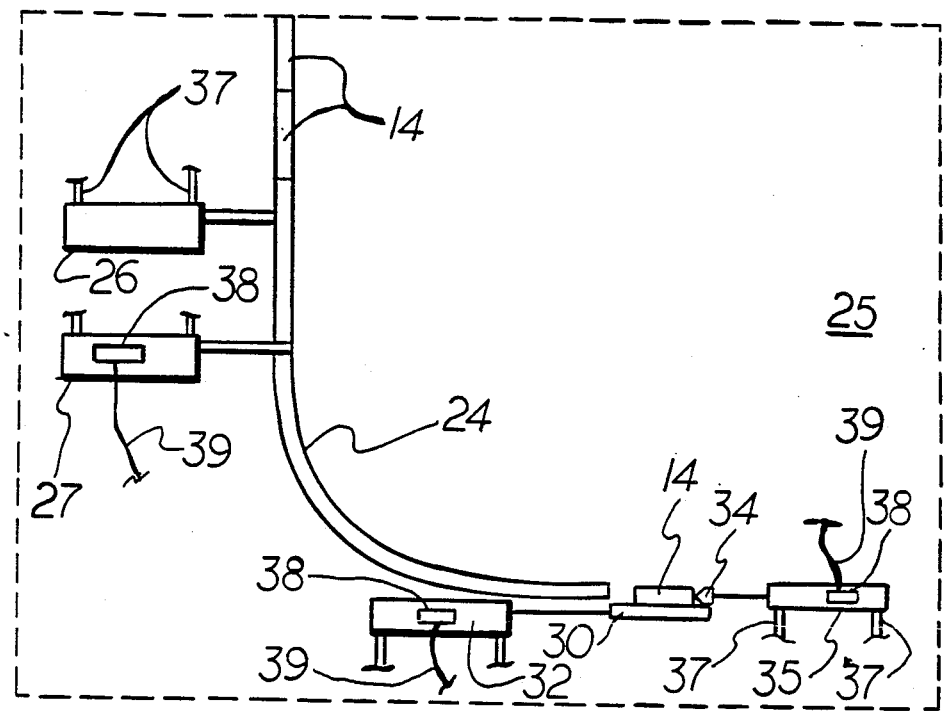
FIG. 2 is a schematic illustration of the feeder mechanism of the DIP insertion machine illustrated in FIG. 1.

The shuttle drops a component 14 into a slot 24 (FIG. 2) of the feeder mechanism 25 and a former pneumatic cylinder 26 advances a lead forming mechanism 28. A gate pneumatic cylinder 27 withdraws a gate bar 29 to sequentially release the formed components. The released component slides down an arcuate chute 31 and comes to rest on a mandrel 30 which has been advanced to the illustrated position by a pneumatic mandrel cylinder 32. The exact position of the component is determined by a stop 34 which has been advanced to the stop position by a pneumatic stop cylinder 35. The pneumatic lines to the cylinders are identified by the reference number 37 and the cylinder position sensors and electrical wires are identified respectively by the reference numbers 38 and 39.

Figure 3:
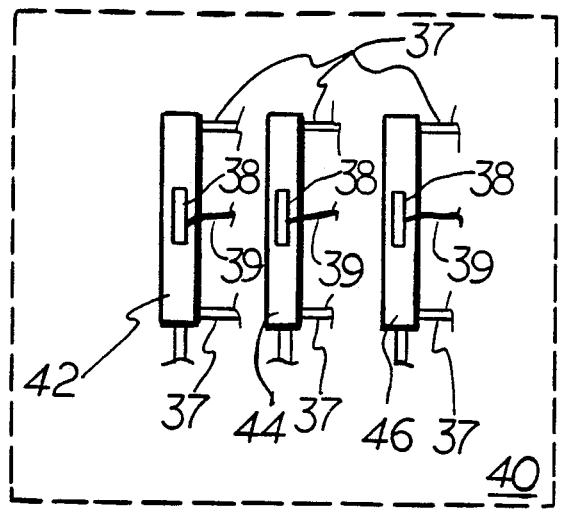
FIG. 3 is a schematic illustration of the inserter mechanism of the DIP insertion machine illustrated in FIG. 1.

The inserter mechanism 40 (FIG. 3), which grips the component supported on the mandrel, partially inserts the gripped component and then pushes the partially inserted component downwardly to fully seat it, traditionally has three pneumatic cylinders: the gripper cylinder 42, the insertion cylinder 44 and the pusher cylinder 46 (details of such an inserter mechanism are disclosed in U.S. Pat. Nos. 4,815,202 and 4,815,203). These cylinders, which are operated by air lines 37, generate position signals via position sensors 38.

Figure 5:
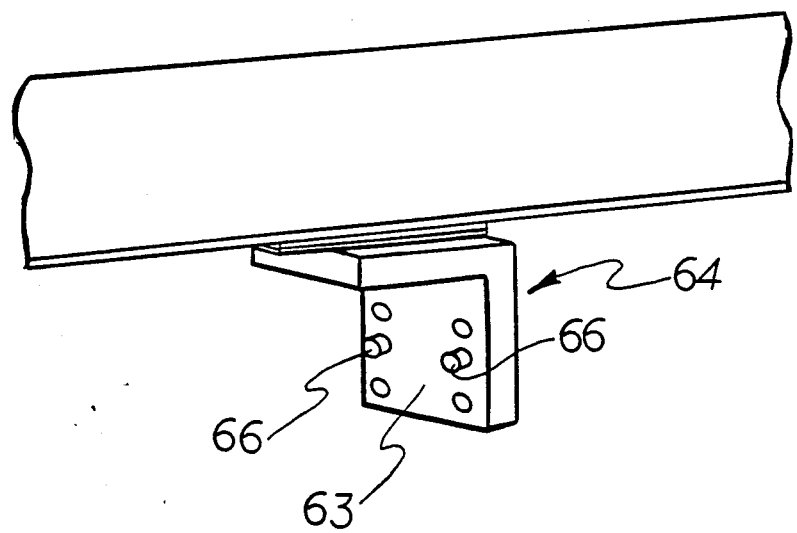
FIG. 5 is an oblique view of a portion of the cross rail of the DIP insertion machine and the mounting bracket for the feeder-inserter assembly.
Figure 4:
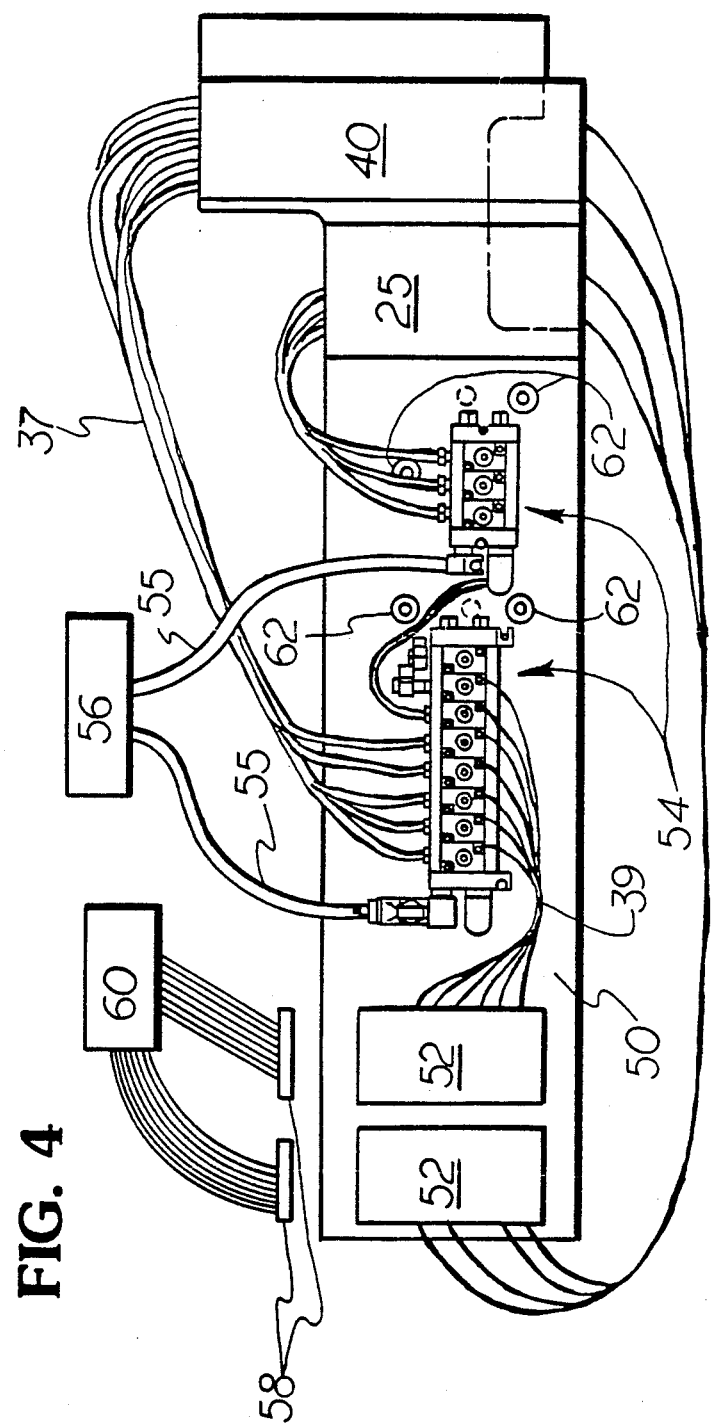
FIG. 4 is a side elevational view of the feeder-inserter assembly of the DIP insertion machine illustrated in FIG. 1.

FIG. 4 illustrates the feeder-inserter assembly which includes an elongated support plate 50 to which is secured the feeder mechanism 25, the inserter mechanism 40, the electronic distribution boards 52 and the valve stack 54 for operating the inserter and feeder mechanisms. As can be seen from FIG. 4, all of the pneumatic lines 37 for operating the pneumatic cylinders of the feeder 25 and inserter 40 mechanisms are connected to the valve stack 54 and all of the control wires 39 for controlling the operation of the valve stack 54 and for communicating with the sensors 38 emanate from the distribution boards 52. To operate the feeder-inserter assembly, the valve stack 54 is connected via air lines 55 to a distribution manifold 56 of the air supply and the distribution boards 52 are connected via multiwire flat cable 58 to the input-output interface of the central processing unit 60. The feeder-inserter assembly may, accordingly, be built and tested at a site remote from the DIP insertion machine (by connecting the assembly to a CPU via multiwire flat cable and 58 and to an air supply via air lines 55 and then secured with suitable screws 62 to the vertical portion 63 of an L-shaped mounting bracket 64 (FIG. 5) which is secured to the bottom of the cross-beam or rail 22. Locating pins 66 may also be used to facilitate securing the feeder-inserter assembly to the mounting bracket.

We claim:

1. An electronic component insertion machine for inserting DIP components into a supported circuit board comprising a cross-beam extending over the supported circuit board, mounting bracket means secured to the bottom of said cross-beam, a feeder-inserter assembly including a supporting plate, feeder mechanism means secured to said supporting plate, said feeder mechanism means including a plurality of pneumatically operated cylinders and sensor means for sensing the position of at least some of said cylinders, inserter mechanism means secured to said supporting plate, said inserter mechanism means including a plurality of pneumatically operated cylinders and sensor means for sensing the position of at least some of said cylinders, valve stack means secured to said supporting plate for pneumatically operating said feeder and inserter cylinders, and distribution board means secured to said supporting plate for electrically operating said valve stack means and for receiving signals from said sensor means whereby said feeder inserter assembly can be operated either when secured to said machine or at a remote location, and means for releasably securing said supporting plate, and hence, said feeder inserter assembly to said mounting bracket means.

2. An electronic component insertion machine according to claim 1, wherein said feeder mechanism means includes first and second feeder cylinders and a mandrel cylinder.

3. An electronic component insertion machine according to claim 2, wherein said inserter mechanism means includes a gripper cylinder, an insertion cylinder and a pusher cylinder.

* * * * *